(12) United States Patent
Jeong

(10) Patent No.: US 7,414,882 B2
(45) Date of Patent: *Aug. 19, 2008

(54) MAGNETIC MEMORY DEVICES HAVING ROTATIONALLY OFFSET MAGNETIC STORAGE ELEMENTS THEREIN

(75) Inventor: Won-Cheol Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/782,423

(22) Filed: Jul. 24, 2007

(65) Prior Publication Data

US 2007/0263431 A1   Nov. 15, 2007

Related U.S. Application Data

(62) Division of application No. 11/342,415, filed on Jan. 30, 2006, now Pat. No. 7,262,989.

(30) Foreign Application Priority Data

Mar. 28, 2005   (KR) ...................... 10-2005-0025562

(51) Int. Cl.
*G11C 11/00* (2006.01)
(52) U.S. Cl. ...................................... 365/158; 365/171
(58) Field of Classification Search ................. 365/158, 365/171, 145
See application file for complete search history.

(56) References Cited

U.S. PATENT DOCUMENTS

| | | | |
|---|---|---|---|
| 5,695,864 | A | 12/1997 | Slonczewski |
| 6,178,131 | B1 | 1/2001 | Ishikawa et al. |

(Continued)

FOREIGN PATENT DOCUMENTS

JP   2002-359355   12/2002

(Continued)

OTHER PUBLICATIONS

Notice to File Response/Amendment to the Examination Report, Korean Application No. 10-2005-0025562, May 25, 2006.

*Primary Examiner*—Vu A Le
(74) *Attorney, Agent, or Firm*—Myers Bigel Sibley & Sajovec

(57) ABSTRACT

Integrated circuit memory devices include a semiconductor substrate and a bit line on the semiconductor substrate. A plurality of memory cells is also provided. Each of these magnetic memory cells includes a magnetic storage element, a magnetic flux focusing layer on the magnetic storage element and an electrically insulating layer extending between the bit line and the magnetic flux focusing layer. This electrically insulating layer may contact an upper surface of the magnetic flux focusing layer and a lower surface of the bit line. The magnetic memory cell further includes a non-ferromagnetic electrically conductive layer extending between the magnetic flux focusing layer and the magnetic storage element. The electrically insulating layer is configured to cause current passing in a first direction (e.g., vertical direction) from the magnetic storage element to the non-ferromagnetic electrically conductive layer during a cell writing operation to spread laterally in the magnetic flux focusing layer (and non-ferromagnetic electrically conductive layer) in a second direction (e.g., lateral direction), which is orthogonal to the first direction. The magnetic flux focusing layer may be formed of a ferromagnetic material, such as NiFe.

15 Claims, 15 Drawing Sheets

U.S. PATENT DOCUMENTS

| | | |
|---|---|---|
| 6,606,263 B1 | 8/2003 | Tang |
| 6,740,947 B1 | 5/2004 | Bhattacharyya et al. |
| 6,791,872 B2 | 9/2004 | Bloomquist et al. |
| 6,891,212 B2 | 5/2005 | Sharma et al. |
| 6,891,746 B2 | 5/2005 | Tran et al. |
| 6,937,506 B2 | 8/2005 | Anthony et al. |
| 7,009,874 B2 | 3/2006 | Deak |
| 7,075,807 B2 * | 7/2006 | Leuschner et al. ............ 365/48 |
| 7,180,113 B2 * | 2/2007 | Braun ........................ 257/295 |
| 7,211,511 B2 | 5/2007 | Horikoshi |
| 2002/0186582 A1 | 12/2002 | Sharma et al. |
| 2003/0104636 A1 | 6/2003 | Bloomquist et al. |
| 2006/0114712 A1 * | 6/2006 | Braun ........................ 365/158 |

FOREIGN PATENT DOCUMENTS

| | | |
|---|---|---|
| KR | 1020040078883 A | 9/2004 |

* cited by examiner

MAGNETIC MEMORY DEVICES HAVING ROTATIONALLY OFFSET MAGNETIC STORAGE ELEMENTS THEREIN

REFERENCE TO PRIORITY APPLICATIONS

This application is a divisional of application Ser. No. 11/342,415, filed Jan. 30, 2006, now U.S. Pat. No. 7,262,989, entitled Magnetic Memory Device Having Flux Focusing Layer Therein, and claims priority to Korean Application Serial No. 2005-25562, filed on Mar. 28, 2005, the disclosures of which are hereby incorporated herein by reference.

FIELD OF THE INVENTION

The present invention relates to integrated circuit memory devices and methods of forming same and, more particularly, to nonvolatile memory devices and methods of forming on-volatile memory devices.

BACKGROUND OF THE INVENTION

Semiconductor memory devices, which may be used to store various types of data, can be divided into volatile memory devices and non-volatile memory devices. The volatile memory devices are typically represented by a dynamic random access memory (DRAM) and a static random access memory (SRAM). The DRAM stores data by using electric charges stored in a capacitor. To prevent the electric charges from leaking off the capacitor, a refresh operation is necessary. However, a power supply is stopped, the data stored in the DRAM may disappear. On the contrary, the non-volatile memory devices keep the stored data even when power is terminated. For this reason, non-volatile memory devices are used widely in circumstances where power cannot be supplied continuously, such as mobile phones and diverse application devices including a memory card for storing music or video data. The non-volatile memory devices include a flash memory representing '0' and '1' of data based on whether tunneling charges are stored or not, a Ferroelectric Random Access Memory (FRAM) using the polarization direction of a dielectric substance, a magnetic RAM (MRAM) using the magnetization direction of a magnetic substance. The flash memory has a disadvantage of slow data erase/write speed and the FRAM has a disadvantage of supporting relatively few rewrite operations (i.e., low reusable number).

The magnetic RAM, which typically does not have the above disadvantages has been attracting attention recently. The MRAM has advantages that it does not have a limit in the reusable number, and it can be highly integrated. Also, it can be operated at a high speed. In a magnetic memory device, data is stored in a simple thin ferromagnetic film or in a multi-layer magnetic thin film, (e.g., Tunneling Magneto-Resistance (TMR)), or in a Giant Magneto-Resistance (GMR). The basic structure and operation of a conventional magnetic memory device using the TMR will be described hereinafter with reference to the drawings.

FIG. 1 is a plane view showing a conventional magnetic memory device, and FIGS. 2A and 2B are cross-sectional views obtained by cutting the magnetic memory device of FIG. 1 along line 2A-2A' and line 2B-2B', respectively. Referring to FIG. 1, a plurality of conducting wires are formed perpendicularly to each other on a semiconductor substrate to thereby form bit lines 30 and digit lines 28. Magnetic storage elements 40 for storing data are formed in the area where the bit lines 30 and the digit lines 28 cross each other. Referring to FIGS. 2A and 2B, an field isolation layer 12 is positioned in a predetermined area of the semiconductor substrate 10 to define active regions. In each active region, a pair of gate electrodes 20 are formed. The gate electrodes 20 include a gate of a transistor used to read data stored in the magnetic storage elements 40. A common source region 16s is formed between the gate electrodes 20, and a drain region 16d is formed between a gate electrode 20 and an field isolation layer 12. The common source region 16s is connected to a common source electrode 18, and the drain region 16d is connected to a vertical wire 24. A bottom interlayer insulation layer 22 is formed on the entire surface of the semiconductor substrate 10 including the digit lines 28. The vertical wire 24 electrically connects the drain region 16d to a bottom electrode 26, which is formed in the upper part of the bottom interlayer insulation layer 22 with a space therefrom. The bottom electrode 26 is connected to the magnetic storage element 40, and a bit line 30 is formed on top of the magnetic storage element 40. Herein, the bottom electrode 26 and the magnetic storage element 40 is insulated by a top interlayer insulation layer 32 formed on top of the bottom interlayer insulation layer 22.

The magnetic storage element 40, which has a structure of Magnetic Tunnel Junction (MTJ) includes a pinning layer 41, a fixed layer 42, an insulating layer 43, and a free layer 44. The resistance of the magnetic storage element 40 is varied according to whether the magnetization directions of the free layer 44 and the fixed layer 42 are the same or not. The resistance characteristic of the magnetic storage element 40, which is dependent on the magnetization direction, is utilized as a data storing mechanism of the magnetic memory device. The magnetization direction of the fixed layer 42 is not changed during a typical reading/writing operation, and the pinning layer 41 fixes the magnetization direction of the fixed layer 42. On the contrary, the magnetization direction of the free layer 44 is variable. The free layer 44 can be magnetized in the same direction as the fixed layer 42 or can be magnetized in the opposite direction.

When data stored in a particular magnetic storage element 40 is read, the bit lines 30 and word lines 20 are used. The word lines 20 correspond to the gate electrodes 20 formed on the semiconductor substrate 10 and they are formed in perpendicular to the bit lines 30. When electric current flows into the magnetic storage element 40 by selecting a word line 20 and a bit line 30, the amplitude of the electric current is different according to the data storage state. In other words, the stored data can be read, because the resistance value is different according to whether the magnetization directions of the fixed layer 42 and the free layer 44 are the same and the amplitude of the electric current is different according to the resistance value. Meanwhile, data are recorded by providing electric current to a bit line 30 and a digit line 28 to select a particular magnetic storage element 40 and magnetizing the selected magnetic storage element 40 based on a vector addition of a magnetic field formed by the electric current.

Hereafter, problems of the conventional magnetic memory device will be described. When electric current flows through the bit lines 30 and the digit lines 28, a magnetic field is formed around the lines 28 and 30. Basically, the magnetic field should affect only the magnetic storage element 40 whose magnetization should be changed. However, as the magnetic memory device is highly integrated, memory cells become close to each other, and the magnitude of the magnetic field needed for writing data increases as well. Therefore, there can be a problem that the magnetic field generated by the bit lines 28 and the digit lines 30 affects not only the selected magnetic storage element 40 but also an adjacent magnetic storage element 40. To solve this problem, a magnetic memory device having a new structure not using the bit lines 28 is suggested. According to the suggested technology, the word lines 20 replace the digit lines 28 and the electric current flows through the word lines 20 and the bit lines 30 to thereby form a magnetic field. The formed magnetic field changes the magnetization direction of the magnetic storage element 40. Meanwhile, it is also possible to change the magnetization direction of the magnetic storage element 40 by increasing the amplitude of electric current, which is provided to the magnetic storage element 40 through the word lines 20 and the bit lines 30, more than when data are read while providing the electric current to the magnetic storage element 40 in the same method as data are read. This magnetic memory device is disclosed in U.S. Pat. No. 5,695,864.

The technology that does not use the digit lines 28, which is described above, can prevent other magnetic storage elements 40 from being affected by the magnetic field due to disturbance caused by the digit lines 28. However, it still has a problem of disturbance caused by the bit lines 30. In particular, in the method of providing electric current to the magnetic storage element 40 to record data, since a high amplitude of electric current flows during the data recording, a strong magnetic field is formed and this enhances the possibility that the magnetic field affects adjacent areas. Also, since the method of recording data only by using the bit lines 30 without the digit lines 28 requires a strong magnetic field necessarily, a method for reducing power consumption is needed.

SUMMARY OF THE INVENTION

Integrated circuit memory devices according to embodiments of the present invention include a semiconductor substrate and a bit line on the semiconductor substrate. The memory device further includes a plurality of memory cells. Each of these magnetic memory cells includes a magnetic storage element, a magnetic flux focusing layer on the magnetic storage element and an electrically insulating layer extending between the bit line and the magnetic flux focusing layer. This electrically insulating layer may contact an upper surface of the magnetic flux focusing layer and a lower surface of the bit line. The magnetic memory cell further includes a non-ferromagnetic electrically conductive layer extending between the magnetic flux focusing layer and the magnetic storage element. According to preferred aspects of these embodiments, the electrically insulating layer is configured to cause current passing in a first direction (e.g., vertical direction) from the magnetic storage element to the non-ferromagnetic electrically conductive layer during a cell writing operation to spread laterally in the magnetic flux focusing layer (and non-ferromagnetic electrically conductive layer) in a second direction (e.g., lateral direction), which is orthogonal to the first direction. The magnetic flux focusing layer may be formed of a ferromagnetic material, such as NiFe.

A magnetic memory device according to additional embodiments of the invention includes a plurality of magnetic storage elements arranged on a semiconductor substrate, a plurality of bit lines positioned in the upper part of the magnetic storage elements and connecting the magnetic storage elements in one direction, a plurality of word lines arranged in a direction crossing the bit lines under the magnetic storage elements, and an anti-disturbance layer formed between the bit lines and the magnetic storage elements.

The anti-disturbance layer includes a barrier layer formed of an insulating substance and a conductive substance, a magnetic flux focusing layer formed of a ferromagnetic substance in the lower part of the barrier layer, and a conductive layer formed of a conductive substance in the lower part of the magnetic flux focusing layer. The barrier layer, the magnetic flux focusing layer, and the conductive layer take in charge of their own function and they can be used individually or by being combined partially. The magnetic flux focusing layer concentrates a magnetic field acting on the magnetic storage element therebelow, and it prevents a magnetic field generated by the bit line in the upper part of the magnetic flux focusing layer from affecting other magnetic storage elements except a selected magnetic storage element. Since the insulating substance of the barrier layer is formed in the upper part of the magnetic storage element, it blocks electric current that has passed through the magnetic storage element from vertically transferring into the bit line. In other words, the electric current transfers horizontally through the conductive layer due to the insulating substance and transfers vertically at a location where the conductive substance of the barrier layer is provided. By doing so, the current flowing through the conductive layer in the horizontal direction generates a magnetic field capable of changing the magnetization direction of the magnetic storage element. Also, since the space between the bit line and the magnetic storage element is increased as much as the thickness of the barrier layer, the barrier layer contributes to the prevention of disturbance caused by the bit line as well. Preferably, the anti-disturbance layer is thinner than the bit line. Also, it is preferable that the conductive substance of the barrier layer is formed of a material the same as that of the bit line in the respect of a fabrication process. A bottom electrode connected to a transistor on the semiconductor substrate is formed in the lower part of the magnetic storage element. Herein, it is preferable that the bottom electrode is formed perpendicularly to the bit line. This is because a magnetic field useful to change the magnetization direction of the magnetic storage element can be generated by the electric current flowing though the bottom electrode. The magnetic storage element includes a pinning layer, a fixed layer, an insulating layer and a free layer formed sequentially, and the data storage state is determined based on the magnetization direction of the free layer.

In another aspect of the present invention, there is provided a technology that can reduce the magnitude of the magnetic field needed for recording data. The magnetic memory device includes a plurality of magnetic storage elements arranged on a semiconductor substrate, a plurality of bit lines positioned in the upper part of the magnetic storage elements and connecting the magnetic storage elements in one direction, a plurality of word lines arranged in the lower part of the magnetic storage elements in a direction crossing the bit lines, source/drain regions formed in both sides of each word line, and a vertical wire connected to a drain region. The vertical wire may be directly connected to the lower part of a magnetic storage element, and the direction that the bit lines connect the magnetic storage elements is not perpendicular to a magnetization direction of the magnetic storage elements. Preferably, the direction is at 45° (135°) with respect to the magnetization direction of the magnetic storage elements.

Additional embodiments of the present invention include methods of forming magnetic memory devices, as described more fully hereinbelow.

DETAILED DESCRIPTION OF THE INVENTION

Figure 1:
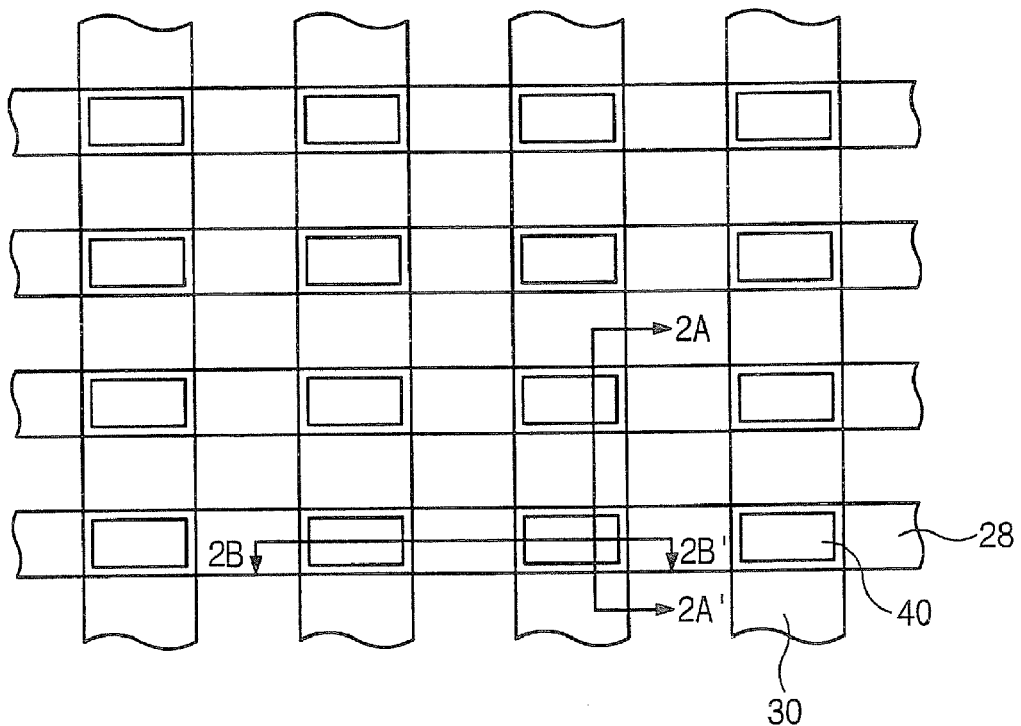
FIG. 1 is a plan view showing a conventional magnetic memory device.
Figure 2A:
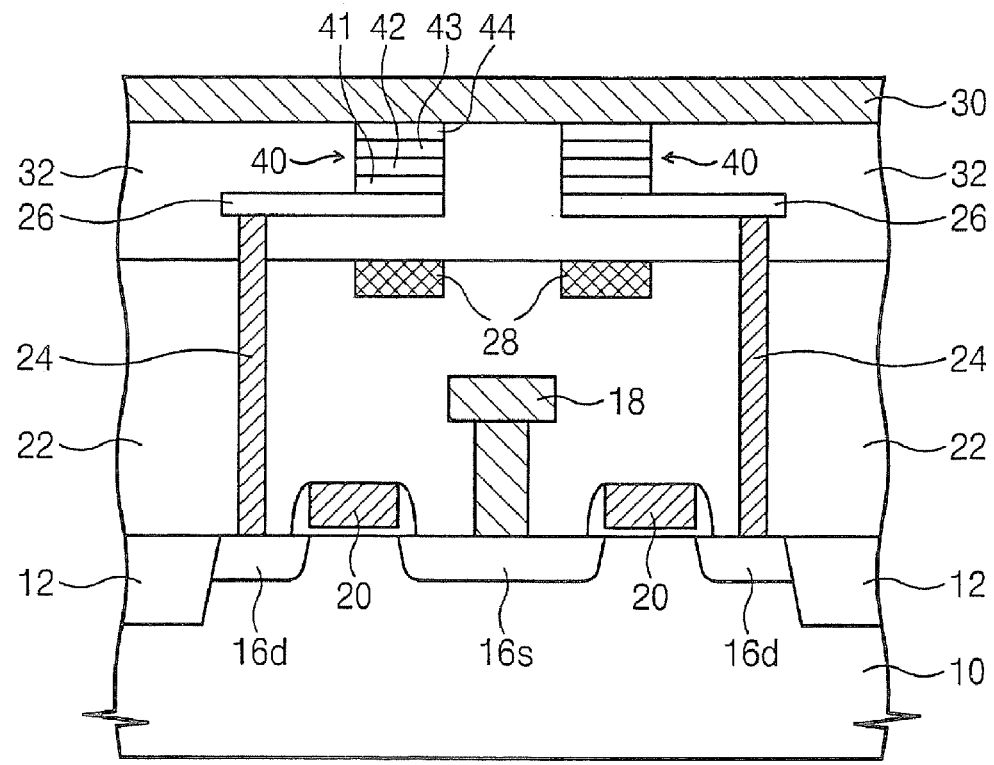
FIGS. 2A and 2B are cross-sectional views obtained by cutting the magnetic memory device of FIG. 1 along line 2A-2A' and line 2B-2B', respectively.
Figure 2B:
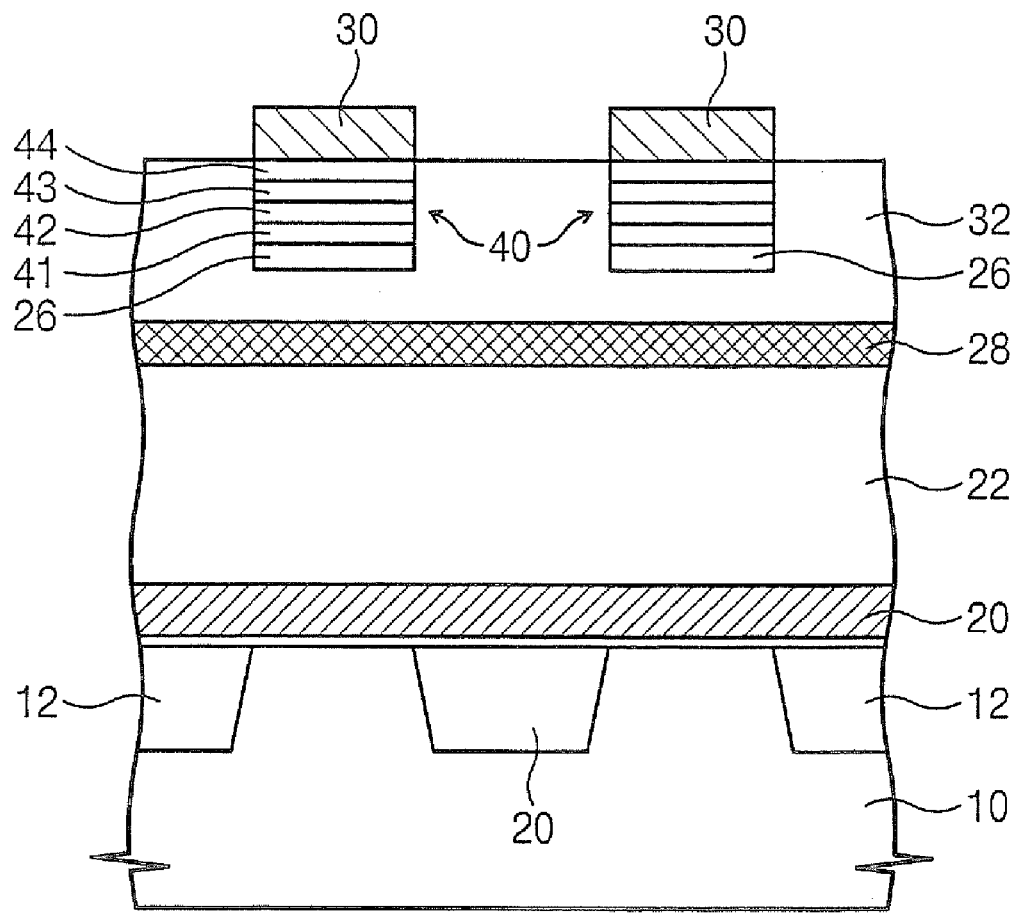
Figure 3:
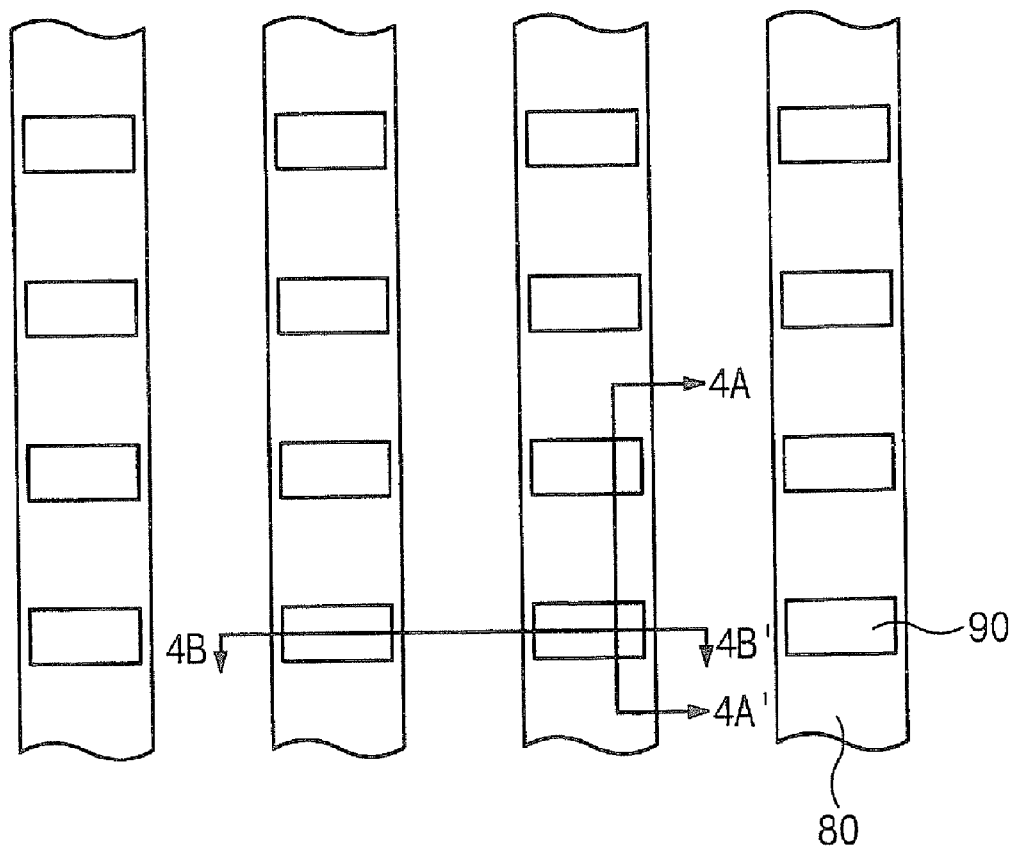
FIG. 3 is a plan view describing a magnetic memory device according to an embodiment of the present invention.
Figure 4A:
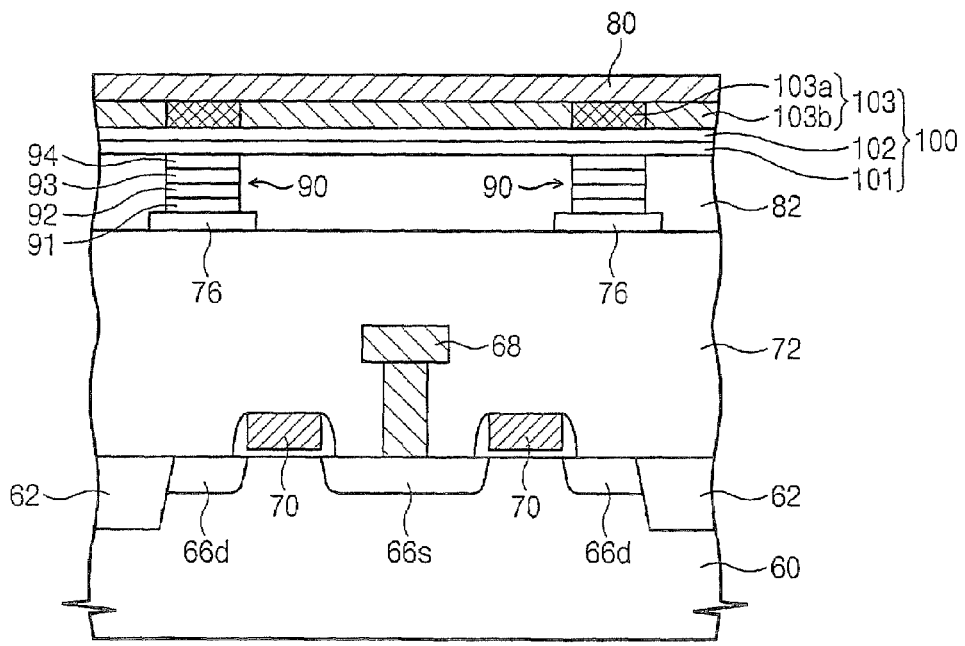
FIGS. 4A and 4B are cross-sectional views obtained by cutting the magnetic memory device of FIG. 3 along a line 4A-4A' and a line 4B-4B', respectively.
Figure 4B:
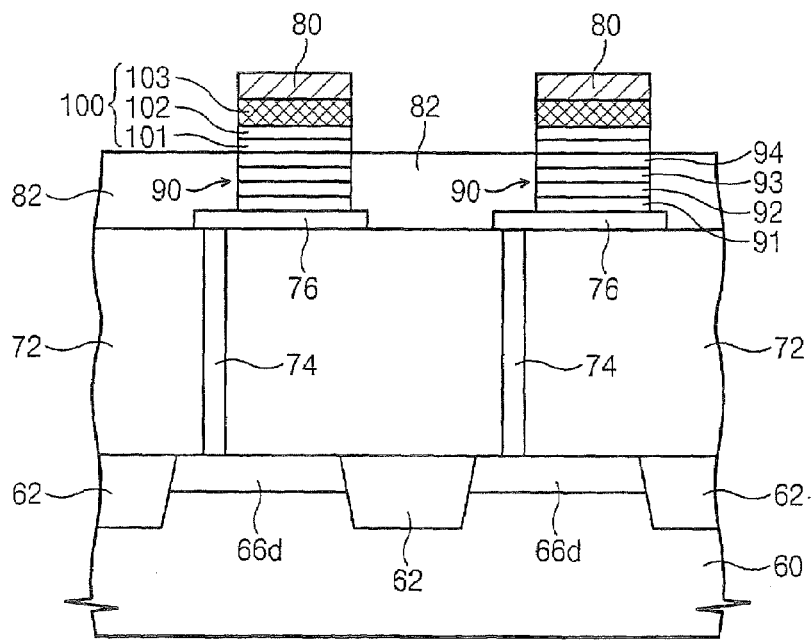

FIG. 3 is a plan view describing a magnetic memory device according to an embodiment of the present invention, and FIGS. 4A and 4B are cross-sectional views obtained by cutting the magnetic memory device of FIG. 3 along a line 4A-4A' and a line 4B-4B', respectively. Referring to FIG. 3, a plurality of bit lines 80 are formed in parallel to each other on a semiconductor substrate in one direction. Also, a plurality of magnetic storage elements 90 for storing data are formed. The bit lines 80 connect the magnetic storage elements 90 in one direction. For example, the bit lines 80 connect the magnetic storage elements 90 in a column direction in FIG. 3. Meanwhile, the magnetic memory device shown in FIG. 3 does not use any digit line. It is possible to add digit lines to the magnetic memory device, but data can be read and written using word lines.

Referring to FIGS. 4A and 4B, a field isolation layer 62 is formed in a predetermined area of the semiconductor substrate 60 to define active regions. A pair of gate electrodes 70 corresponding to word lines 70 are formed in each active region. The word lines 70 are formed in perpendicular direction to the bit lines 80, and the magnetic storage elements 90 for storing data are positioned in an area where the bit lines 80 and the word lines 70 are crossed. A common source region 66s is formed between the gate electrodes 70, and a drain region 66d is formed between a gate electrode 70 and an field isolation layer 62. The common source region 66s is connected to a common source electrode 68, and the drain region 66d is connected to a vertical wire 74. The vertical wire 74 is connected to a bottom electrode 76 in the upper part of the vertical wire 74, and the bottom electrode 76 is connected to a magnetic storage element 90. An anti-disturbance layer 100 is formed on top of the magnetic storage element 90, and the bit lines 80 are formed on top of the anti-disturbance layer 100. Also, the magnetic storage elements 90 are insulated by interlayer insulation layers 72 and 82. For the sake of convenience in description, the area where the vertical wire 74 penetrates is called a bottom interlayer insulation layer 72, and the upper area is called a top interlayer insulation layer 82. The anti-disturbance layer 100 is formed along the bit line 80 and prevents a magnetic field generated by electric current flowing through the bit lines 80 from affecting other magnetic storage elements 90 that are not selected. The specific functions and operation mechanism will be described with reference to FIG. 5.

Figure 5:
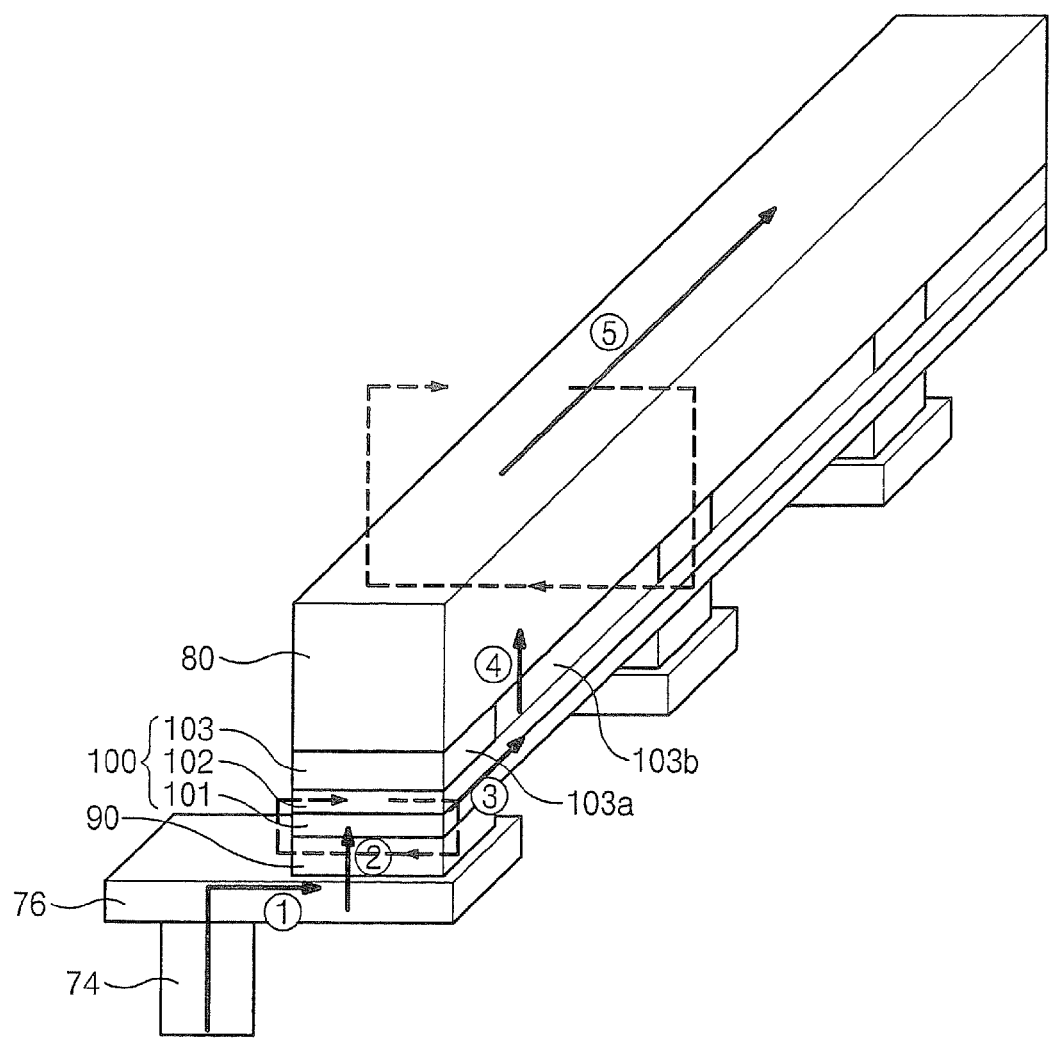
FIG. 5 is a perspective view illustrating an operation mechanism for disturbance prevention according to the present invention.

FIG. 5 is a perspective view illustrating an operation mechanism for disturbance prevention. Referring to FIG. 5, the anti-disturbance layer 100 describe herein is formed in a structure of three layers: a conductive layer 101, a magnetic flux focusing layer 102, and a barrier layer 103. Whereas the conductive layer 101 and the magnetic flux focusing layer 102 are formed of a single layer material, the barrier layer 103 may be formed of different layer materials including an insulating substance 103a and a conductive substance 103b. The insulating substance 103a is positioned in the upper part of the magnetic storage element 90. Since the magnetic storage elements 90 are placed in predetermined positions apart from each other, the insulating substance 103a of the barrier layer 103 is provided in positions with a predetermined space from each other. In the space between the insulating substance 103a, the conductive substance 103b is provided. It is efficient that the conductive substance 103b is the same as the material that forms the bit lines 80 in the respect of fabrication process.

The anti-disturbance layer 100 functions independently. They can be used individually or by combining part of them. The effect of the anti-disturbance layer 100 is enhanced when electric current flows through the magnetic storage elements 90. In the conventional magnetic memory devices, since electric current flows into the magnetic storage elements 90 in a data reading mode, the technology of the present invention can be applied to the conventional magnetic memory devices. However, since weak electric current flows in the data reading mode, the present invention is more useful in a magnetic memory device where strong electric current flows in a data writing mode. Therefore, the operation effect of the magnetic memory device suggested in the present invention will be described, hereafter, with a focus on a method where data are written while electric current passes through the magnetic storage elements 90.

In FIG. 5, the arrow direction indicates the direction in which electric current flows in the data writing mode. As shown in FIG. 5, the electric current passes through the vertical wire 74 in a source/drain region (not shown) of a transistor and goes to the bottom electrode 76 connected to the vertical wire 74, the magnetic storage elements 90, the anti-disturbance layer 100, and the bit lines 80. When the electric current flows as above, the anti-disturbance layer 100 is operated as follows. Among the conductive layer 101, the magnetic flux focusing layer 102, and the barrier layer 103 of the anti-disturbance layer 100, the magnetic flux focusing layer 102 is formed of a material having a high magnetic permeability. Generally a material having a high magnetic permeability is used to concentrate magnetic flux. Using this phenomenon, the disturbance caused by the bit lines can be reduced. In short, when the electric current passing through the magnetic storage elements 90 during the data writing flows through the bit line 80 a magnetic field (see dotted line in FIG. 5) is formed around the bit line 80 by the electric current. The magnetic field around the bit line 80 is focused in the upper part of the magnetic flux focusing layer 102, due to the magnetic flux focusing layer 102 between the bit line 80 and the magnetic storage element 90. Consequently, the magnetic flux focusing layer 102 functions as a sort of a barrier layer preventing the magnetic field from significantly affecting the magnetic storage element 90 therebelow.

Hereafter, the operation mechanism of the conductive layer 101 and the barrier layer 103 will be described. Without the barrier layer 103, the electric current that has passed through the magnetic storage element 90 directly goes to the bit line 80. Since the barrier layer 103 includes the insulating substance 103a in the upper part of the magnetic storage element 90, the electric current passing through the magnetic storage element 90 cannot go to the bit line directly. Since the barrier layer 103 also includes the conductive substance 103b, the electric current whose path is blocked by the insulating substance 103a changes the path in the horizontal direction and then changes the path in the vertical direction in an area where the conductive substance 103b is placed and the electric current is transferred into the bit line 80. Herein, in consideration of a conductive layer 101 formed in the upper part of the magnetic storage element 90, the path of the electric current is: the horizontal direction 1 of the bottom electrode 76→the vertical direction 2 of the magnetic storage element 90→the horizontal direction 3 of the conductive layer 101 and magnetic flux focusing layer 102→the vertical direction 4 of the magnetic flux focusing layer 102 and the conductive substance 103b of the barrier layer 103→the horizontal direction 5 of the bit line 80. When the electric current flows through the above path, the electric current flowing along the conductive layer 101 in the horizontal direction forms the magnetic field (see dotted line in FIG. 5) and changes the magnetization direction of the magnetic storage element 90. Meanwhile, the space between the bit line 80 and the magnetic storage element 90 is widened as much as the thickness of the barrier layer 103 and the conductive layer 101. Since the magnitude of the magnetic field is in inverse proportion to the distance from an electric current source, the magnetic field of the bit line 80 affecting the magnetic storage element 90 is reduced as much as the thickness of the barrier layer 103 and the conductive layer 101. Therefore, the barrier layer 103 contributes to the prevention of disturbance caused by the bit line 80 as well.

As shown in FIG. 5, when the structure of the conductive layer 101/barrier layer 103 is combined with the structure of the magnetic flux focusing layer 102, an additional effect other than the aforementioned effects is generated. In other words, when the magnetic flux focusing layer 102 is formed between the conductive layer 101 and the barrier layer 103, the magnetic field generated upon the flow of the electric current in the horizontal direction can act on the magnetic storage element 90 while the magnetic field is focused by the magnetic flux focusing layer 102. The magnetic flux focusing layer 102 performs a function of focusing the magnetic field onto the magnetic storage element 90 with respect to the electric current that passes under the magnetic flux focusing layer 102. And the magnetic flux focusing layer 102 prevents the magnetic field from affecting other magnetic storage elements 90 except the selected magnetic storage element 90 with respect to the electric current that passes over the magnetic flux focusing layer 102. The functions of the magnetic flux focusing layer 102 can be enhanced by forming the magnetic flux focusing layer 102 not only in the upper surface of the conductive layer 101 but also in both sidewalls.

Hereafter, the material of the anti-disturbance layer 100 will be described. The conductive layer 101 is formed of a conductive substance, and the magnetic flux focusing layer 102 is formed of a ferromagnetic substance. The barrier layer 103 is formed of the insulating substance 103a and the conductive substance 103b. It is preferable that the conductive layer 101 has a higher resistance than the bit line 80. If the conductive layer 101 has a lower resistance than the bit line 80, the electric current that has passed through the magnetic storage element 90 and the conductive layer 101 comes to flow in the horizontal direction along the conductive layer 101 rather than being transferred to the bit line 80. By the same reasoning, the conductive layer 101 may be formed of a material having a lower resistance than the magnetic flux focusing layer 102. However, if the resistance of the conductive layer 101 is higher than that of the magnetic flux focusing layer 102, the electric current that has passed through the magnetic storage element 90 vertically is not transferred to the conductive layer 101 but is transferred to the magnetic flux focusing layer 102 in the horizontal direction. Herein, the magnetic field generated by the electric current is limited mainly into the inside of the magnetic flux focusing layer 102. Therefore, it is preferable that the magnetic flux focusing layer 102 is formed of a ferromagnetic substance and has a higher resistance than the conductive layer 101. When the resistance of the magnetic flux focusing layer 102 is higher than that of the conductive layer 101, the magnetic flux focusing layer 102 can block the electric current that has passed through the magnetic storage element 90 and the conductive layer 101 from flowing into the bit line 80. Also, it is possible to control the electric current to flow to the bit line 80 by forming the anti-disturbance layer 100 thinner than the bit line 80. To have a look at the material of the barrier layer 103, it is preferable that the conductive substance 103b is formed of a material having a lower resistance than the magnetic flux focusing layer 102 and the conductive layer 101, which is the same as that of the bit line 80 in the respect of fabrication process. The insulating substance 103a does not have any specific restriction in its material and it can be formed of the same material that forms the interlayer insulation layer. In conformity to the conditions, the conductive layer 101 can be formed as a composite of Ti/TiN/Ta, and the magnetic flux focusing layer 102 can be formed of NiFe. The barrier layer 103 can be formed of a typical oxide (103a) and Al/W (103b) having an excellent conductivity, which is also used to form the bit line 80.

Meanwhile, the bottom electrode 76 and the bit line 80 are formed in perpendicular to each other in the structure of FIG. 5. The electric current flowing along the bottom electrode 76 in the horizontal direction is used to change the magnetization direction of the magnetic storage element 90 as well. However, when the bottom electrode 76 and the bit line 80 are perpendicular to each other, the amplitude of the electric current needed to change the magnetization direction of the magnetic storage element 90 is reduced, compared to a case when the bottom electrode 76 and the bit line 80 are formed in parallel. When they are formed in parallel, the electric current flowing the bottom electrode 76 flows in the same direction as the electric current flows along the conductive layer 111 to thereby form magnetic fields in opposite directions in the upper and lower part of the magnetic storage element 90. Thus, it is a disadvantage when compared to a case when they are formed perpendicularly to each other. Also, when the bottom electrode 76 and the bit line 80 are formed in perpendicular to each other, an effect generated based on another characteristics of the magnetic memory device suggested in the present invention can be applied. In other words, when the bit line 80 and the magnetic storage element 90 are formed to be offset, the magnitude of the magnetic field needed for the data writing is reduced. This operation mechanism is partially applied to the case when the bottom electrode 76 and the bit line 80 are formed perpendicularly.

In FIG. 5, the vertical wire 74 is not directly formed in the lower part of the magnetic storage element 90 but it is formed with a predetermined space from the magnetic storage element 90 by the medium of the bottom electrode 76. This is to use the electric current flowing through the bottom electrode 76 for the data writing but, since the vertical wire 74 and the magnetic storage element 90 are not formed in the same vertical axis, cell space is increased. Thus, if the magnitude of the magnetic field needed for the data writing can be decreased, the vertical wire 74 can be formed in the same axis as the magnetic storage element 90 to thereby reduce the cell space and contribute to higher integration.

Figure 6A:
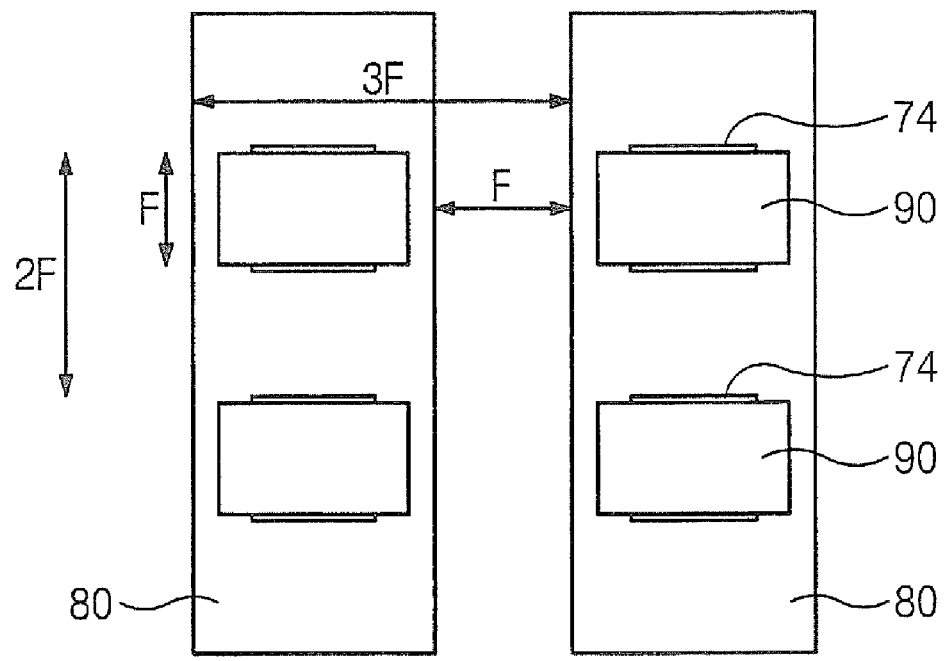
FIGS. 6A to 6C are diagrams describing how a magnetic memory device is operated by a weak magnetic field.
Figure 6A:
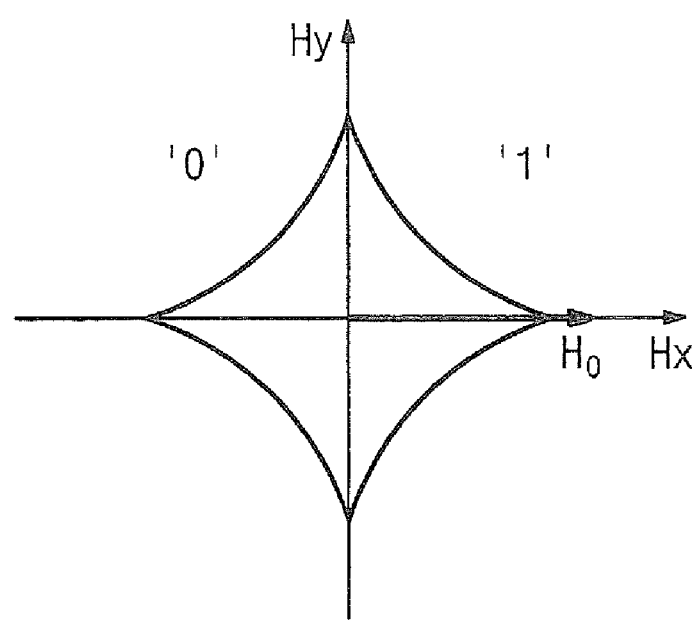
Figure 6B:
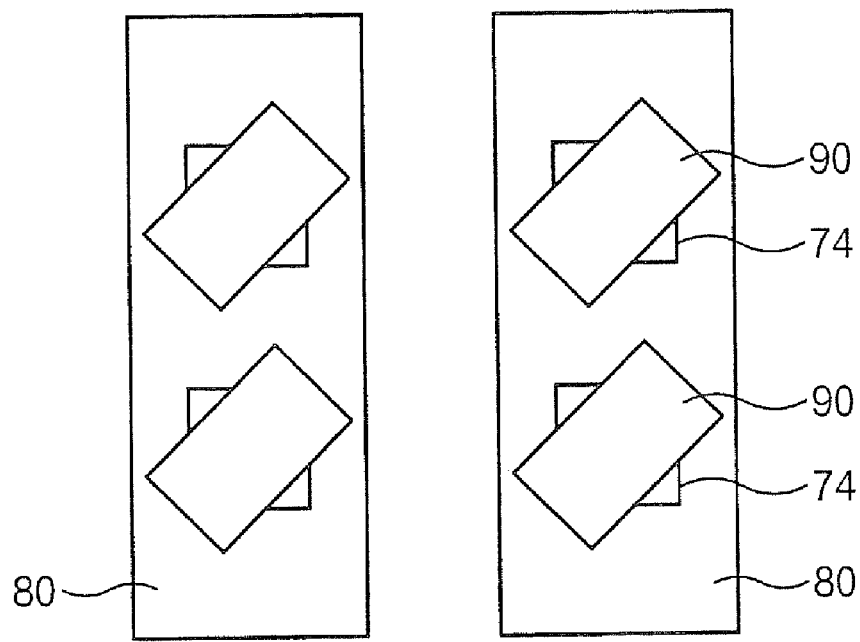
Figure 6B:
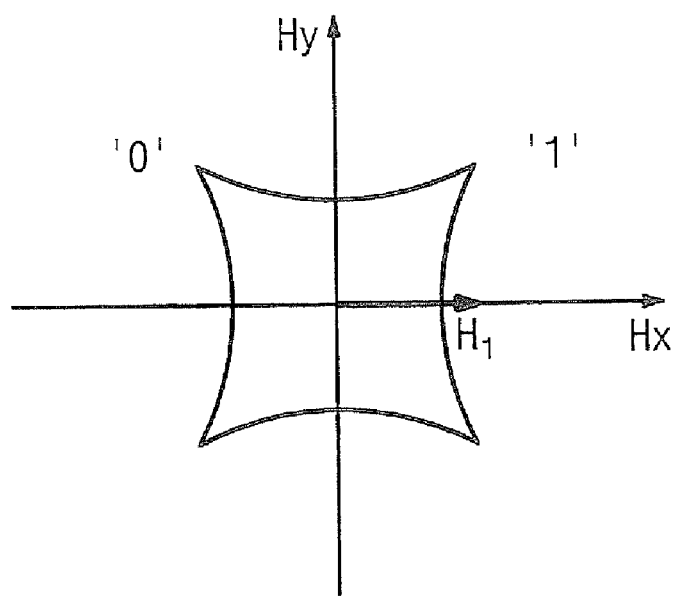
Figure 6C:
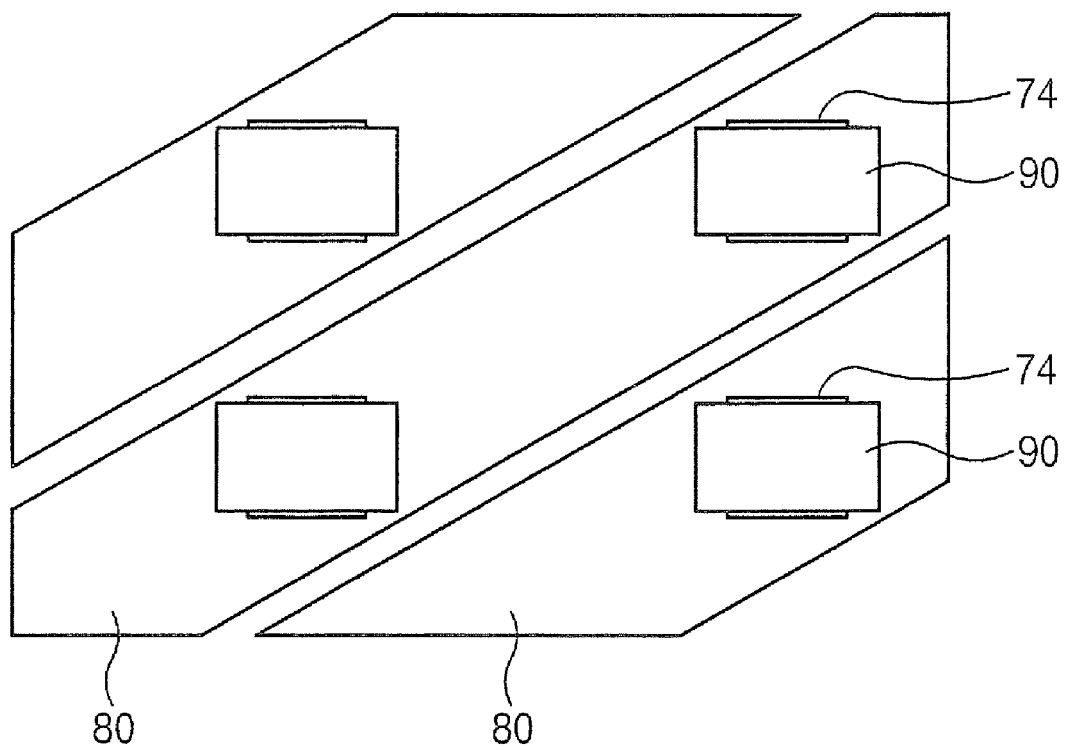
Figure 6C:
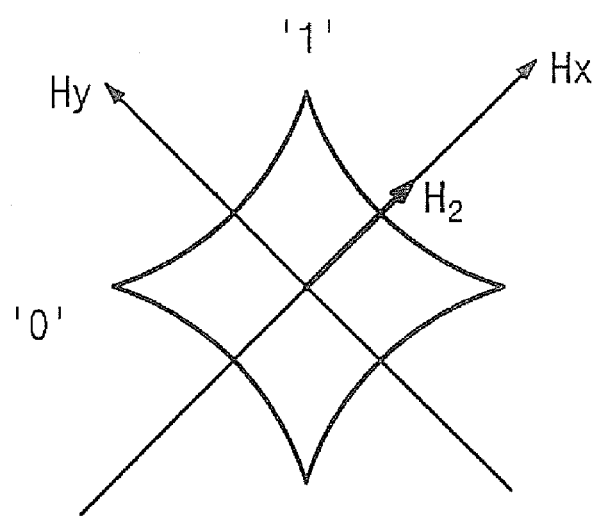

FIGS. 6A through 6C are diagrams describing how a magnetic memory device is operated by a small magnitude of magnetic field. The drawings present plan views on an essential part of the magnetic memory device and graphs representing a magnetic field needed for the data writing. Although the directions are specified as 'a row direction' and 'a column direction' in FIGS. 6A through 6C for the sake of convenience in description hereinafter, the row direction and the column direction can be replaced for each other.

FIG. 6A shows the magnetic storage elements 90 where data is stored and the bit lines 80 connecting the magnetic storage elements 90 in one direction. The vertical wires 74 are directly connected to the lower part of the magnetic storage elements 90 and this reduces the cell area to $6F^2$, where F denotes the minimum feature size. Meanwhile, the graph shown in FIG. 6A represents a magnetic field needed to write data by flowing the electric current through the digit lines and bit lines 80 in a conventional magnetic memory device. In short, the so-called asteroid curve in the graph presents threshold values needed to reverse the magnetization direction of the magnetic storage element 90. Therefore, the magnetic field should have a magnitude higher than the threshold values of the asteroid curve. When the electric current flows in the column direction in the plan view of FIG. 6A, the formed magnetic field acts in the row direction to the magnetic storage element 90 under the bit line 80. In short, the row axis of the graph of FIG. 6A indicates the magnetic field caused by the bit line 80. The column axis of the graph indicates the magnetic field caused by the digit line. In case where no digit line is used, the magnetization direction of the magnetic storage element 90 should be changed by using only the bit line 80. Herein, a magnetic field ($H_0$) corresponding to an intersection point between the asteroid curve and the row axis (Hx) is needed.

FIG. 6B shows the magnetic storage elements 90 formed to be rotationally offset at a predetermined angle and the bit lines 80 connecting the magnetic storage elements 90 in the column direction in parallel. When the magnetic storage elements 90 are formed to be rotationally offset, the asteroid curve determined based on the magnetic storage elements 90 is rotated as much as the offset angle of the magnetic storage elements 90. Typical magnetic storage elements 90 have a rectangular shape to compensate for magnetic anisotropy, and they are magnetized in the row direction to the long side of the rectangular shape while data are stored. Therefore, the asteroid curve is rotated as much as the offset angle of the long sides of the magnetic storage elements 90 or the offset angle with respect to the row axis of the magnetization direction. Herein, the magnitude of the magnetic field needed to change the magnetization direction of the magnetic storage element 90 by using only the bit line 80 becomes the intersection point between the asteroid curve and the row axis (Hx). As illustrated in the graph of FIG. 6B, when the data of the magnetic storage element 90 are changed by using only the bit line 80, the magnitude of the magnetic field ($H_1$) is decreased in comparison with the magnetic field ($H_0$) of FIG. 6A. In the graph of FIG. 6B, the offset angle minimizing the magnitude of the magnetic field is 45° (135°).

Referring to FIG. 6C, the magnetic storage elements 90 are formed in the same manner as that of FIG. 6A but the bit lines 80 connect to the magnetic storage elements 90 in an offset direction with respect to the column direction. Since the bit lines 80 are formed to be offset, the asteroid curve related to the magnetic storage elements 90 remains the same as shown in FIG. 6B, but the axis representing the magnetic field is rotated as much as the offset angle. Herein, the magnitude of the magnetic field needed to change the data of the magnetic storage element 90 by using only the bit line 80 is the intersection point between the asteroid curve and an $H_x$ axis. As illustrated in FIG. 6C, the magnetic field ($H_2$) is reduced compared to the magnetic field ($H_0$) of FIG. 6A, and the offset angle minimizing the magnetic field is 45° (135°).

An anti-disturbance layer shown in FIG. 5 can be added to the bit lines 80 of FIG. 6B or 6C. The magnetic memory device with the anti-disturbance layer added thereto has the following advantages. Since the vertical wire 74 is directly formed in the lower part of the magnetic storage element 90 and no digit line is used, the cell area can be reduced. Secondly, the magnetic field needed to write data can be reduced by forming the bit lines 80 or the magnetic storage elements 90 to be rotated relative to each other. In addition, the anti-disturbance layer composed of the conductive layer, the magnetic flux focusing layer, and the barrier layer inhibits the magnetic field from affecting other adjacent magnetic storage elements 90 except the selected magnetic storage element 90.

Hereinafter, a method for fabricating the magnetic memory device will be described. FIGS. 7A through 11A are cross-sectional views obtained by cutting the magnetic memory device of FIG. 3 along a line 4A-4A', and FIGS. 7B through 11B are cross-sectional views obtained by cutting the magnetic memory device of FIG. 3 along a line 4B-4B'. The process cross-sectional views are obtained from the magnetic memory device of FIG. 3, but they can be easily applied to the magnetic memory device having rotationally offset bit lines or rotationally offset magnetic storage elements.

Figure 7A:
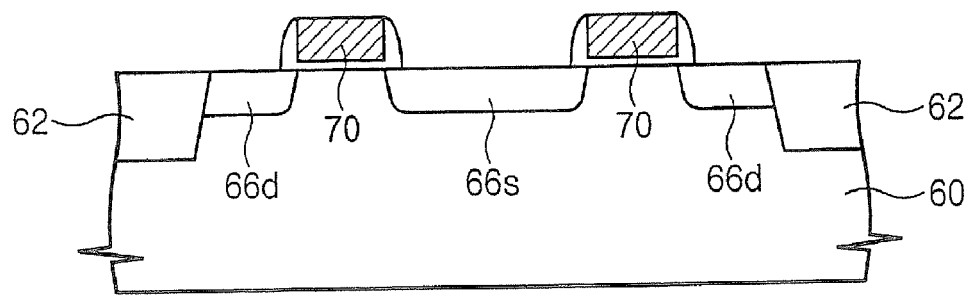
FIGS. 7A, 8A, 9A, 10A and 11A are cross-sectional views obtained by cutting the magnetic memory device of FIG. 3 along a line 4A-4A' to describe a fabrication process.
Figure 7B:
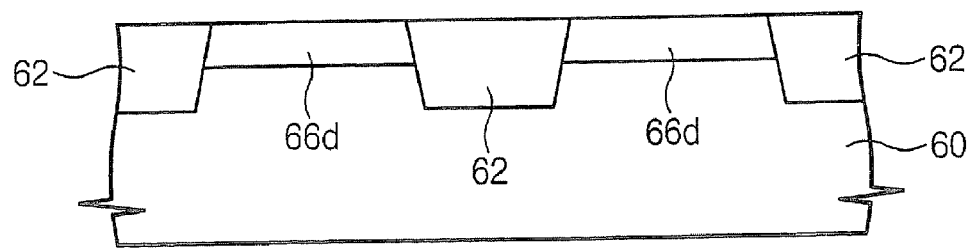
FIGS. 7B, 8B, 9B, 10B and 11B are cross-sectional views obtained by cutting the magnetic memory device of FIG. 3 along a line 4B-4B' to describe the fabrication process.

Referring to FIGS. 7A and 7B, an field isolation layer 62 is formed in a predetermined area of the semiconductor substrate 60 to confine active regions. The field isolation layer 62 can be formed using a conventional Shallow Trench Isolation (STI) method. Then, a gate insulating layer and a gate conductive layer are formed sequentially on the entire surface of the semiconductor substrate 60. The gate insulating layer and the gate conductive layer are patterned sequentially to thereby form a plurality of gate patterns traversing the upper part of the active regions and the field isolation layer 62. Herein, what is patterned on the gate conductive layer is a gate electrode 70, which corresponds to a word line 70. Subsequently, impurity ions are injected into the semiconductor substrate 60, using gate electrode 70 as an implant mask to thereby form a common source region 66s and a drain region 66d. The common source region 66s, the drain region 66d, and the gate electrode 70 form a single transistor. Then, spacers are formed in the sidewalls of the gate electrode 70.

Figure 8A:
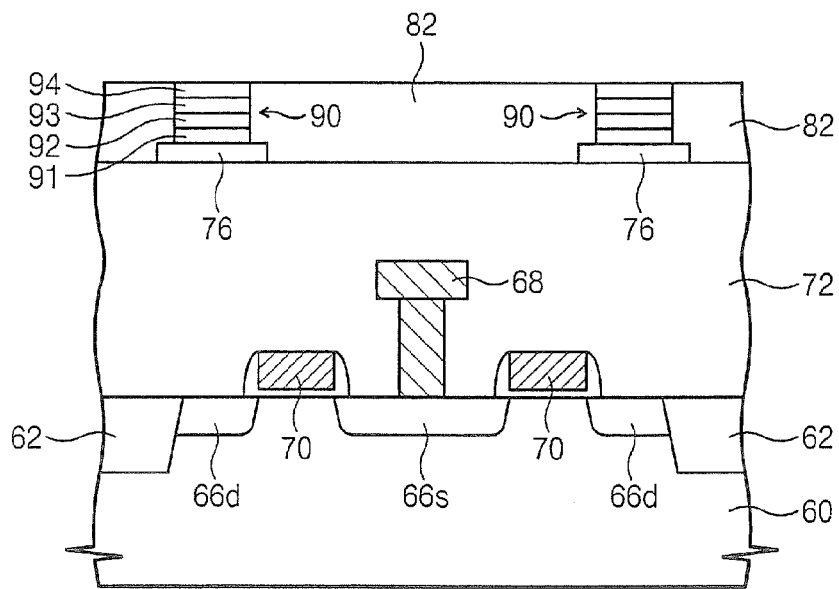
Figure 8B:
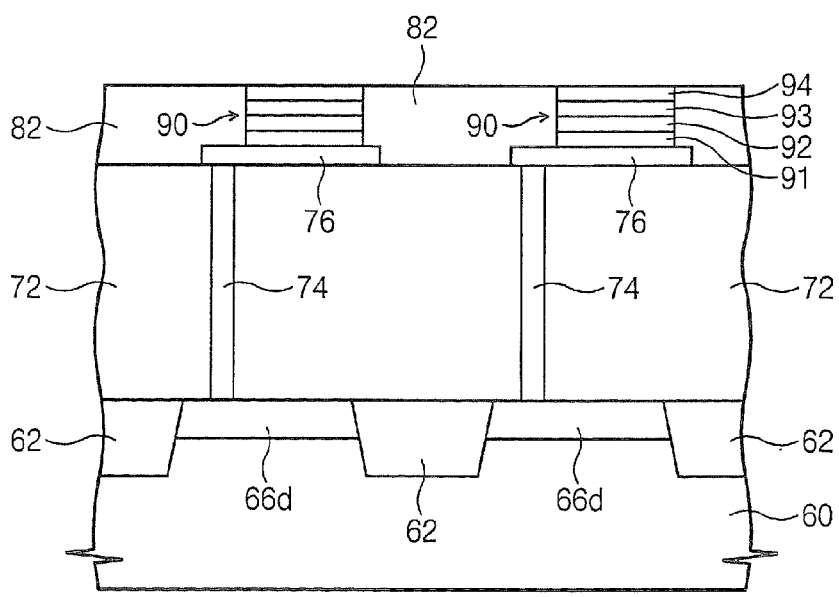

Referring to FIGS. 8A and 8B, a bottom interlayer insulation layer 72 is formed in the entire surface of the semiconductor substrate 60. The bottom interlayer insulation layer 72 is patterned to thereby expose the common source region 66s and the drain region 66d. The exposed part is buried in a conventional method to thereby form a common source electrode 68 and a vertical wire 74. The vertical wire 74 connects the drain region 66d to a bottom electrode 76 to be formed subsequently.

The bottom electrode 76 and a magnetic storage element 90 is formed on the bottom interlayer insulation layer 72. The bottom electrode 76 is formed in the same direction as the word line 70. The word line 70 is perpendicular to a bit line 80, which will be formed later. Consequently, the bottom electrode 76 and the bit line 80 are formed perpendicularly to each other. The magnetic storage element 90 typically includes a pinning layer 91, a fixed layer 92, an insulating layer 93, and a free layer 94. The pinning layer 91 is a anti-ferromagnetic layer, which may be formed of IrMn, PtMn, MnO, FeO, CoCl$_2$, NiCl$_2$, NiO, or Cr. The fixed layer 92 and the free layer 94 are ferromagnetic layers, which is formed of Fe, Co, Ni, MnSb, CrO$_2$. As for the insulating layer 93, a typical aluminum oxide layer is used. After the magnetic storage elements 90 are formed as described above, a top interlayer insulation layer 82 is formed. The top interlayer insulation layer 82 is planarized to expose the upper surface of the free layer 94.

Figure 9A:
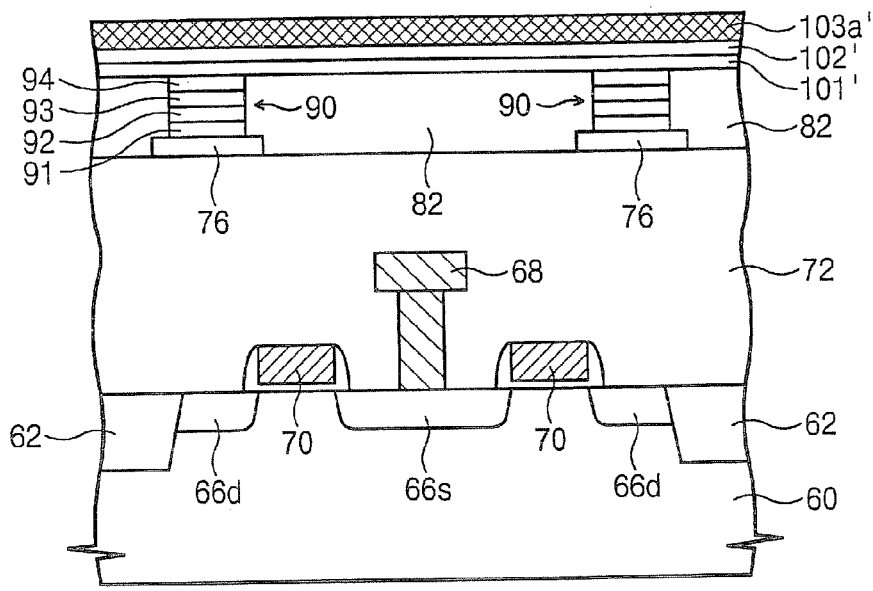
Figure 9B:
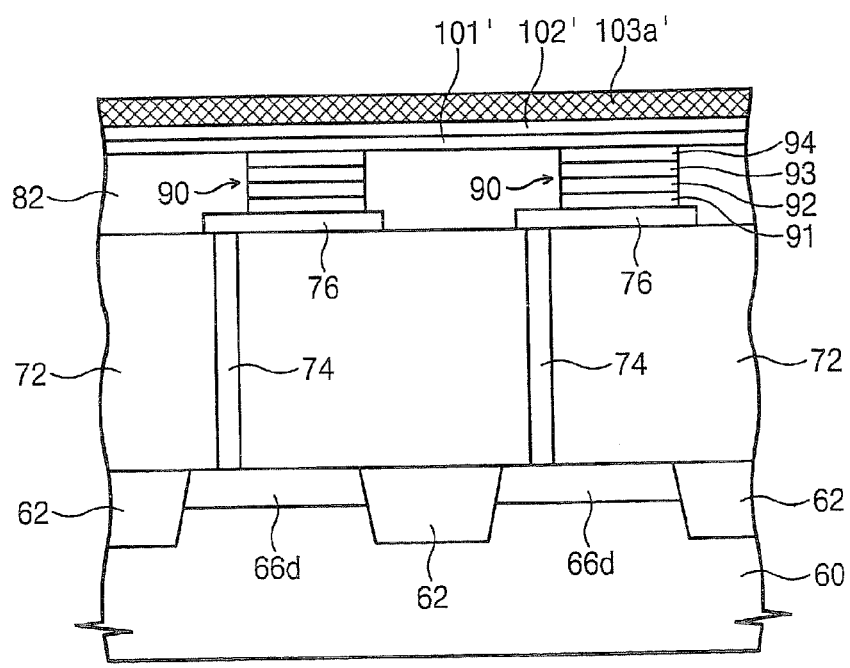

Referring to FIGS. 9A and 9B, material layers 101' and 102' for a conductive layer and a magnetic flux focusing layer are formed on the semiconductor substrate 60 with the top interlayer insulation layer 82 in order to form an anti-disturbance layer. Then, a material layer 103' for a barrier layer is formed on the material layers 101' and 102' for a conductive layer and a magnetic flux focusing layer. Among a conductive substance and an insulating substance that form the barrier layer, the insulating substance layer 103a' is formed. If an oxide is used as the insulating substance, an oxidation or deposition process can be used.

Figure 10A:
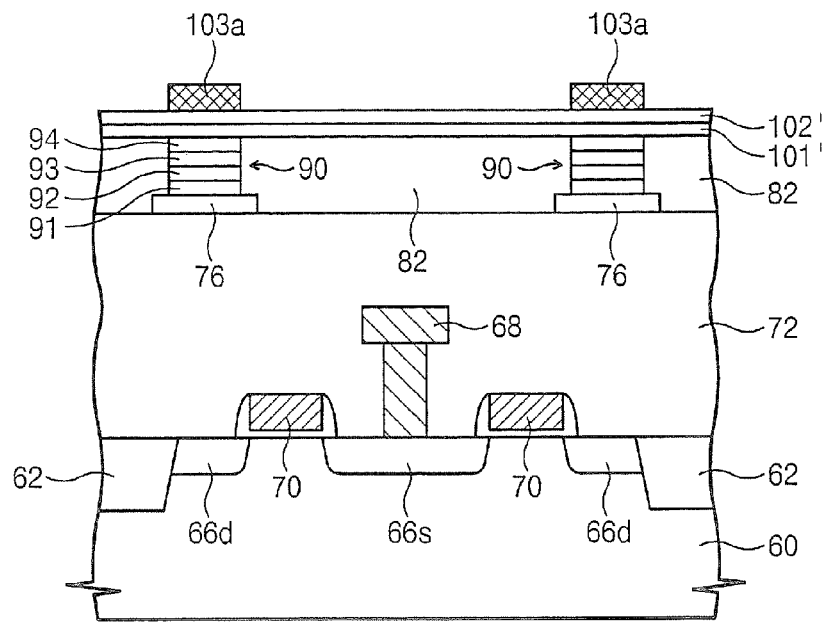
Figure 10B:
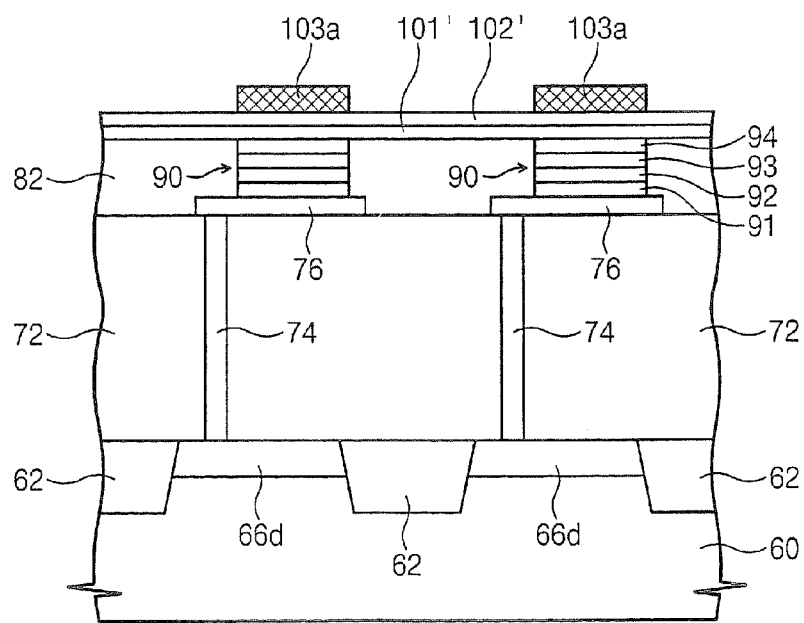

Referring to FIGS. 10A and 10B, the insulating substance is removed by performing a photolithography process on the insulating substance layer 103a' while leaving the insulating substance only in the upper part of the area where the magnetic storage element 90 is formed. What is left after the etching forms an insulating substance 103a of the barrier layer. If the conductive substance of the barrier layer is formed of a material different from that of the bit line, the barrier layer can be completed by inserting an additional conductive material into a predetermined region among the area where the insulating substance is etched out.

Figure 11A:
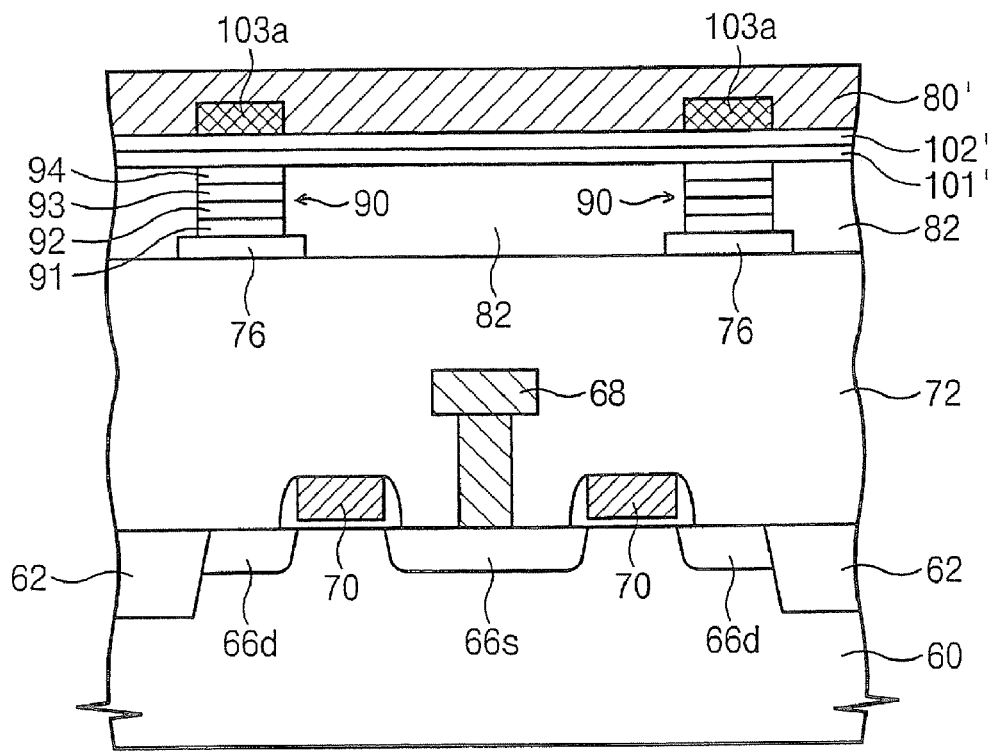
Figure 11B:
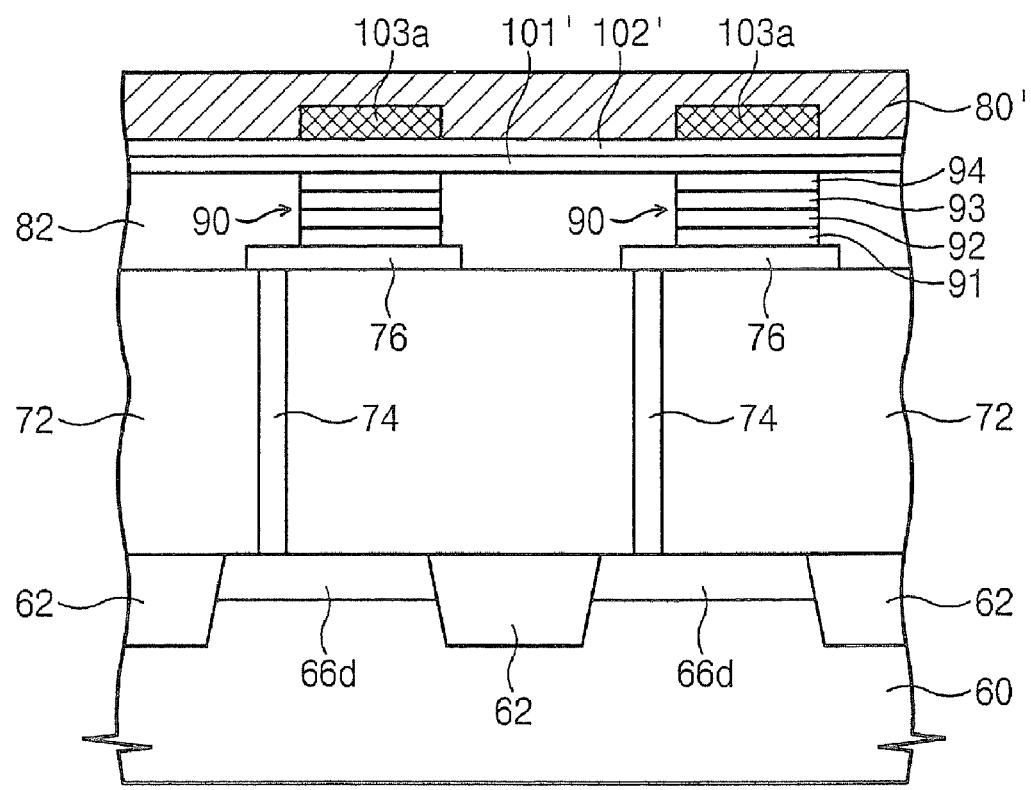

Referring to FIGS. 11A and 11B, a metal layer 80' for bit lines is formed on the resulting substrate illustrated by FIGS. 10A-10B. Herein, the metal layer 80' fills the space between the insulating substances 103a in the lower part. Subsequently, the metal layer 80' for bit lines, the material layers 101' and 102' for the conductive layer and the magnetic flux focusing layer are etched out using the same patterning step. Consequently, the conductive layer/the magnetic flux focusing layer/the bit line are formed just as shown in FIGS. 4A and 4B and, in addition, the barrier layer formed of the conductive substance and the insulating substance is formed. When the anti-disturbance layer is formed as described above, since the conductive layer/the magnetic flux focusing layer are formed simultaneously in the same pattern as the bit line, no mask is needed additionally. If any, since a mask for forming the insulating substance of the barrier layer and the photolithography process are added, the magnetic memory device can be fabricated through a simple process generally.

As described above, since the magnetic memory device of the present invention includes the anti-disturbance layer in the lower part of the bit line, it can prevent the magnetic field generated by the electric current flowing through the bit line from affecting other magnetic storage elements 90 that are not selected.

In addition, since the technology of the present invention can reduce the magnitude of the magnetic field needed to read or write data by forming the bit line connecting the magnetic storage elements 90 in a direction that is not perpendicular to the magnetization direction of the magnetic storage elements 90 but rotationally offset at a proper angle, which is 45° (135°) preferably.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A magnetic memory device, comprising:
    an array of magnetic storage elements having fixed ferromagnetic layers therein on a semiconductor substrate;
    a plurality of bit lines electrically coupled to said array of magnetic storage elements, said plurality of bit lines extending in a first direction across the semiconductor substrate that is rotated at 45° relative to a magnetic orientation of the fixed ferromagnetic layers; and
    an array of magnetic flux focusing layers extending between said plurality of bit lines and said array of magnetic storage elements, with each of said array of magnetic flux focusing layers comprising at least one ferromagnetic material.

2. The memory device of claim 1, further comprising a plurality of word lines extending in a second direction across the semiconductor substrate that is parallel to the magnetic orientation of the fixed ferromagnetic layers.

3. The memory device of claim 1, wherein each magnetic flux focusing layer in said array of magnetic flux focusing layers is separated from a corresponding one of said array of magnetic storage elements by a respective electrically conductive layer that is connected to a corresponding one of said plurality of bit lines.

4. The memory device of claim 3, wherein each magnetic flux focusing layer in said array of magnetic flux focusing layers is separated from a corresponding one of said plurality of bit lines by a respective electrically insulating barrier region.

5. The memory device of claim 4, wherein each magnetic flux focusing layer in said array of magnetic flux focusing layers contacts a corresponding electrically insulating barrier region.

6. An integrated circuit memory device, comprising:
    a substrate;
    a bit line extending in a first direction across said substrate; and
    a magnetic memory cell comprising:
        a magnetic storage element having a fixed ferromagnetic layer therein with a magnetic orientation that is rotated at a fixed angle relative to the first direction;
        a magnetic flux focusing layer on the magnetic storage element; and
        an electrically insulating barrier region extending between said bit line and said magnetic flux focusing layer.

7. The memory device of claim 6, wherein the electrically insulating barrier region contacts an upper surface of the magnetic flux focusing layer and a lower surface of said bit line.

8. The memory device of claim 7, wherein said magnetic memory cell further comprises a non-ferromagnetic electrically conductive layer extending between the magnetic flux focusing layer and the magnetic storage element.

9. The memory device of claim 8, wherein the electrically insulating barrier region is configured to cause current passing in a first direction from the magnetic storage element to the non-ferromagnetic electrically conductive layer during a cell writing operation to spread laterally in the non-ferromagnetic electrically conductive layer in a second direction orthogonal to the first direction.

10. The memory device of claim 9, wherein the magnetic flux focusing layer comprises a ferromagnetic material.

11. The memory device of claim 10, wherein the ferromagnetic material is NiFe.

12. The memory device of claim 10, wherein the non-ferromagnetic electrically conductive layer comprises at least one of a titanium layer, titanium nitride layer and a tantalum nitride layer.

13. The memory device of claim 10, wherein the non-ferromagnetic electrically conductive layer has a lower resistivity than the magnetic flux focusing layer.

14. An integrated circuit memory device, comprising:
a substrate;
a bit line extending in a first direction across said substrate; and
a magnetic memory cell comprising:
a magnetic storage element having a fixed ferromagnetic layer therein with a magnetic orientation that is rotated at a fixed angle relative to the first direction;
a magnetic flux focusing layer on the magnetic storage element; and
an electrically insulating barrier region extending between said bit line and said magnetic flux focusing layer, said electrically insulating barrier region configured to cause current passing in a second direction from the magnetic storage element to the magnetic flux focusing layer during a cell writing operation to spread laterally in the magnetic flux focusing layer in a third direction orthogonal to the second direction.

15. The memory device of claim 14, wherein said magnetic flux focusing layer comprises a ferromagnetic material.

\* \* \* \* \*